(12) United States Patent
Hsieh

(10) Patent No.: US 7,574,318 B2
(45) Date of Patent: Aug. 11, 2009

(54) I/O PORT TESTER

(75) Inventor: Ming-Chih Hsieh, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 109 days.

(21) Appl. No.: 11/759,244

(22) Filed: Jun. 7, 2007

(65) Prior Publication Data

US 2008/0143370 A1      Jun. 19, 2008

(30) Foreign Application Priority Data

Dec. 19, 2006   (CN)   .................. 2006 1 0201331

(51) Int. Cl.
  *G01R 35/00*   (2006.01)
  *G01R 31/02*   (2006.01)
(52) U.S. Cl. ...................... 702/108; 324/763
(58) Field of Classification Search ................. 702/108, 702/117, 118, 120, 119, 121, 122; 703/4, 703/14, 20, 21, 25; 324/763, 765; 710/1, 710/2, 3, 5, 7
See application file for complete search history.

(56) References Cited

U.S. PATENT DOCUMENTS

| | | | |
|---|---|---|---|
| 5,428,800 A * | 6/1995 | Hsieh et al. ................... 326/82 |
| 5,557,741 A * | 9/1996 | Jones .......................... 714/43 |
| 6,289,293 B1 * | 9/2001 | Huang ......................... 702/117 |
| 6,397,361 B1 * | 5/2002 | Saitoh ......................... 714/724 |
| 6,560,734 B1 * | 5/2003 | Whetsel ....................... 714/724 |
| 6,792,378 B2 * | 9/2004 | Chen et al. ................... 702/119 |
| 6,807,504 B2 * | 10/2004 | Chen et al. ................... 702/118 |
| 7,275,965 B1 * | 10/2007 | Liu et al. ..................... 439/632 |
| 7,352,169 B2 * | 4/2008 | Abraham et al. ......... 324/158.1 |

\* cited by examiner

*Primary Examiner*—Michael P. Nghiem
*Assistant Examiner*—Toan M Le
(74) *Attorney, Agent, or Firm*—Frank R. Niranjan

(57) ABSTRACT

An I/O port tester includes a first relay, a second relay, a first resistor, a second resistor, a plurality of serial plugs, a water sensor plug, a direct current (DC) voltage plug, and two data plugs. A half of the serial plugs is correspondingly connected to the other half of the serial plugs. The DC voltage plug is connected to the water sensor plug via a switch of the first relay and the first resistor, and connected to the water sensor plug via a switch of the second relay and the second resistor. The first and second resistors respectively simulate two different working conditions. The data plugs are respectively connected to an inductance coil of the first relay, and an inductance coil of the second relay.

12 Claims, 2 Drawing Sheets

I/O PORT TESTER

BACKGROUND OF THE INVENTION

1. Field of the Invention

The present invention relates to testers, and particularly to an input/output (I/O) port tester which can test I/O ports of electronic devices.

2. Description of related art

Generally speaking, most electronic devices have I/O ports for communicating with other external devices. Before selling these electronic devices, manufacturers need to test the I/O ports of the electronic devices.

Referring to FIG. 1, a partial circuit diagram of a conventional network monitor device is provided. The network monitor device includes twelve I/O ports 1a-12a. The I/O ports 1a-4a are serial communication ports adapted for connecting with serial communication devices such as RS485/422 communication devices. The I/O port 5a is a voltage source port for supplying power. The I/O port 6a is a water sensor port adapted for connecting with a water sensor device for testing whether moisture has penetrated the network monitor device. The I/O port 7a is a direct current (DC) sensor port for detecting a DC power source. The I/O port 8a is a ground port. The I/O ports 9a and 10a are relay ports. The I/O ports 11a and 12a are data ports for controlling external devices. Users need to use many kinds of testers to test the ports 1a-12a respectively, such as a serial communication port tester to test the I/O ports 1a-4a and a water sensor device to test the I/O port 6a, which is unduly laborious and time-consuming and inconvenient.

What is desired, therefore, is to provide an I/O port tester which can conveniently test many kinds of I/O ports of an electrical device.

SUMMARY OF THE INVENTION

An exemplary I/O port tester includes a first relay, a second relay, a first resistor, a second resistor, a plurality of serial plugs, a water sensor plug, a direct current (DC) voltage plug, and two data plugs. A half of the serial plugs is correspondingly connected to the other half of the serial plugs. The DC voltage plug is connected to the water sensor plug via a switch of the first relay and the first resistor, and connected to the water sensor plug via a switch of the second relay and the second resistor. The first and second resistors respectively simulate two different working conditions. The data plugs are respectively connected to an inductance coil of the first relay, and an inductance coil of the second relay.

Other advantages and novel features of the present invention will become more apparent from the following detailed description of preferred embodiment when taken in conjunction with the accompanying drawings, in which:

DETAILED DESCRIPTION OF THE INVENTION

Figure 2:
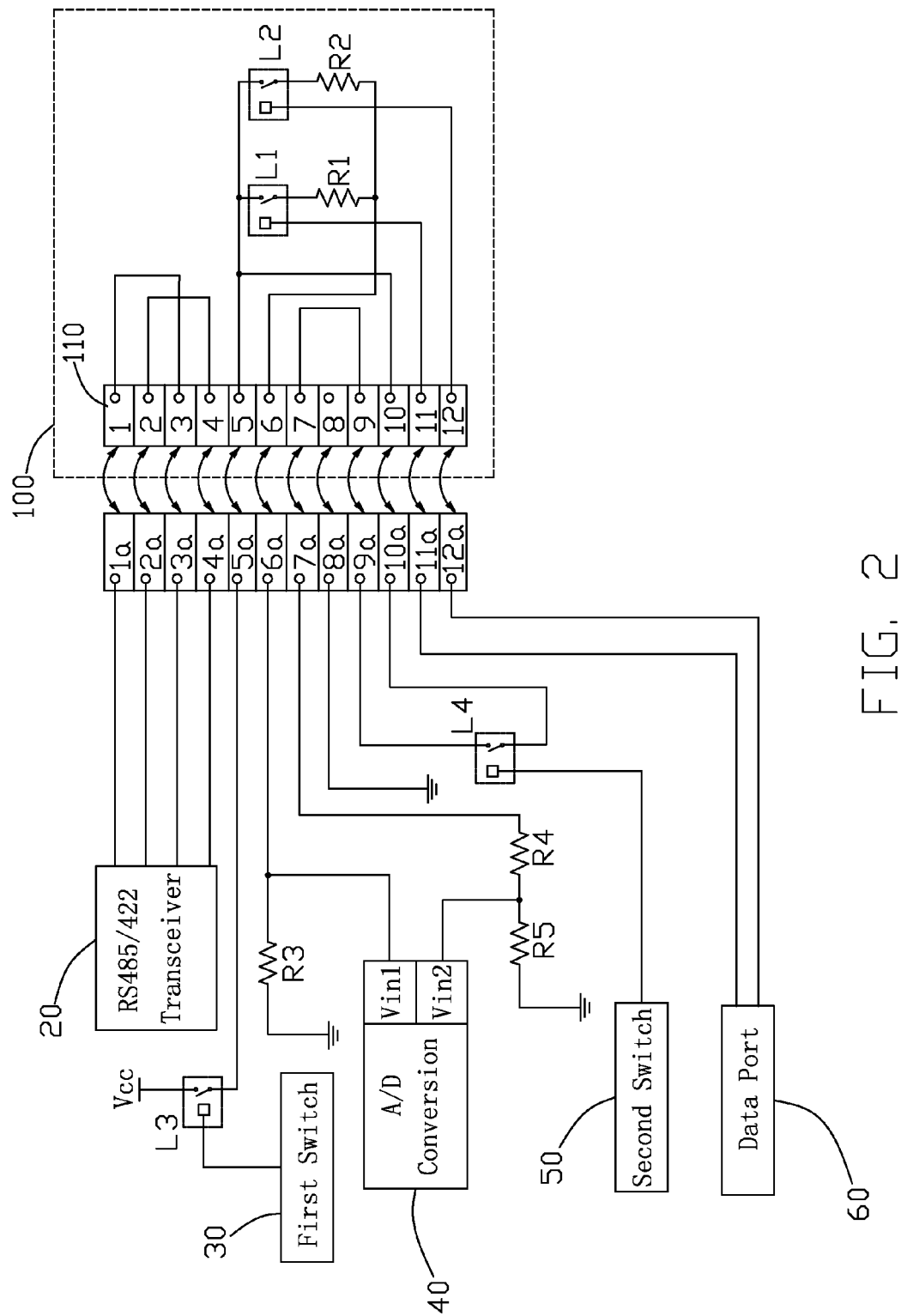
FIG. 2 is a circuit diagram of an I/O port tester in accordance with a preferred embodiment of the present invention for testing the conventional network monitor device of FIG. 1.

Referring to FIG. 2, an I/O port tester 100 in accordance with an embodiment of the present invention is provided for testing I/O ports of an electrical device. The I/O port tester 100 includes an I/O port connector 110, a first relay L1, a second relay L2, a first resistor R1, and a second resistor R2 all assembled on a circuit board (not shown). The I/O port connector 110 can directly plug into the I/O ports of the electrical device.

Figure 1:
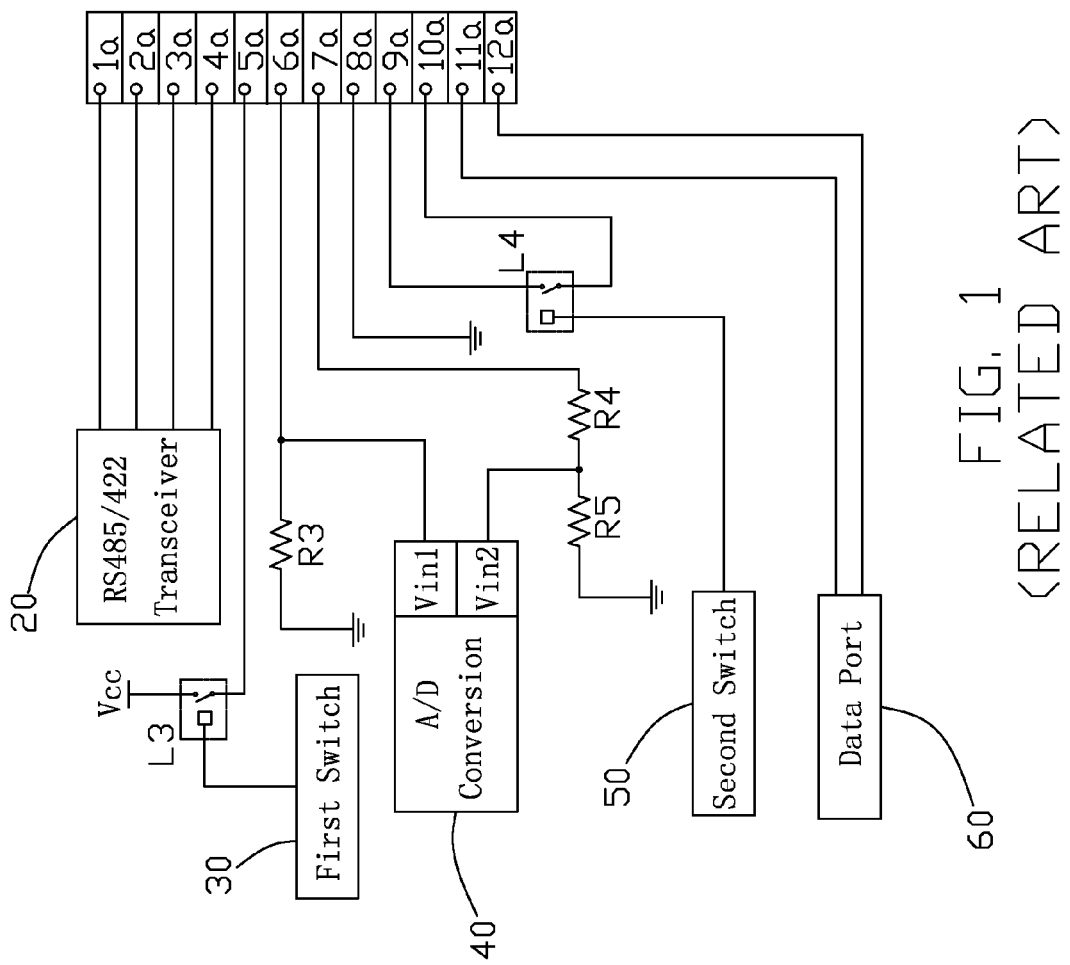
FIG. 1 is a partial circuit diagram of a conventional network monitor device.

In this embodiment, the electrical device is the network monitor device which is shown in FIG. 1. The I/O ports 1a-4a are connected to a serial communication port transceiver such as a RS485/422 transceiver 20. The I/O port 5a is connected to a direct current (DC) power source Vcc via a switch of a third relay L3. A first switch 30 is connected to an inductance coil of the third relay L3 for controlling the switch of the third relay L3. The I/O port 6a is grounded via a third resistor R3, and connected to a signal input Vin1 of an analog/digital (A/D) converter 40. The I/O port 7a is grounded via a fourth resistor R4 and a fifth resistor R5 connected in series. A node between the fourth resistor R4 and the fifth resistor R5 is connected to another signal input Vin2 of the A/D converter 40. The I/O port 8a is grounded. The I/O port 9a is connected to the I/O port 110a via a switch of a fourth relay L4. A second switch 50 is connected to an inductance coil of the fourth relay L4 for controlling the switch of the fourth relay L4. The I/O ports 11a and 12a are connected to a data port for controlling external devices.

The I/O port connector 110 of the I/O port tester 100 includes twelve plugs 1-12 respectively corresponding to the I/O ports 1a-12a. The twelve plugs 1-12 include two serial plugs 1-2 for receiving signals, two serial plugs 3-4 for transmitting signals, a DC voltage plug 5, a water sensor plug 6, a DC sensor plug 7, a ground plug 8, a first relay plug 9, a second relay plug 10, and data plugs 11-12. The plug 1 is connected to the plug 3. The plug 2 is connected to the plug 4. The plug 5 is connected to the plug 10, and to the plug 6 via a switch of the first relay L1 and the first resistor R1, and a switch of the second relay L2 and the second resistor R2. The plug 7 is connected to the plug 9. The plug 11 is connected to an inductance coil of the first relay L1 for controlling the switch of the first relay L1. The plug 12 is connected to an inductance coil of the second relay L2 for controlling the switch of the second relay L2.

When testing the I/O ports 1a-12a of the network monitor device, the plugs 1-12 of the I/O port connector 110 are correspondingly plugged into the I/O ports 1a-12a of the network monitor device. Firstly, an internal processor (not shown) of the network monitor device transmits a command signal to the RS485/422 transceiver 20, and then the transceiver 20 transmits a test signal to the I/O ports 1a and 2a. If the I/O ports 1a-4a are good, the test signal returns to the I/O ports 3a and 4a of the transceiver 20 via the plug 1, 3 and 2, 4 of the I/O port connector 110, and when the transceiver 20 receives the test signal, an indicating device such as a display (not shown) of the network monitor device indicates a passing result. If the test signal is not received then a failing result is indicated, which means one or more of the I/O ports 1a-4a are bad.

Secondly, if the I/O ports 1a-4a pass, the processor transmits a control signal to the first switch 30, the first switch 30 controls the third relay L3 to close, thereby the DC power source Vcc is connected to the I/O port 5a. At the same time, the processor also transmits a control signal to the second switch 50, the second switch 50 controls the fourth relay L4 to close. The DC power source Vcc is connected to the I/O port 7a via the I/O port 5a, plug 5, plug 10, I/O port 10a, I/O port 9a, plug 9, and plug 7 in turn. The processor tests a voltage of the I/O port 7a via the A/D converter 40, if the tested voltage of the I/O port 7a is equal to a voltage of the DC power source Vcc, the I/O ports 5a, 7a, 9a and 10a are good, and the result is indicated by the display. If the tested voltage of the I/O port 7a is not equal to the voltage of the DC power source Vcc, one or more of the I/O ports 5a, 7a, 9a and 10a are bad, and the result is indicated on the display.

Thirdly, if the I/O ports 5a, 7a, 9a and 10a pass, the processor transmits a control signal to the data port, the data port is connected to the first relay L1 and second relay L2 via the I/O ports 11a-12a and plugs 11-12. The control signal controls the first relay L1 to close, and the first resistor R1 is used to simulate a water-sensor wire in a dry condition. The A/D converter 40 tests the first resistor R1 via the I/O port 6a and plug 6, if the test data doesn't satisfy a standard of the simulated dry water-sensor wire, the I/O port 6a is bad, and the result is indicated on the display of the network monitor device. If the test data satisfies the standard of the simulated dry water-sensor wire, the processor transmits another control signal to the data port to control the first relay L1 to open and the second relay L2 to close. The second resistor R2 is used to simulate a wet water-sensor wire. The A/D converter 40 tests the second resistor R2 via the I/O port 6a and plug 6, if the test data satisfies a standard of the simulated wet water-sensor wire, the I/O port 6a is good, and the result is indicated on the display. If the test data doesn't satisfy the standard of the simulated wet water-sensor wire, the I/O port 6a is bad, and the result is indicated on the display.

When testing the I/O port 6a, the I/O ports 11a and 12a are also tested. If one or more of the I/O ports 6a, 11a, and 12a are bad, failure is indicated by the display otherwise passing is indicated. Because the I/O port 8a is grounded, it typically needs not to be tested.

By use of the aforementioned test process, the I/O ports 1a-12a are quickly tested with the use of only one test device. Thereby, the I/O port tester 100 can increase test speed and reduce costs.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An I/O port tester configured for testing input/output (I/0) ports of an electrical device, the I/O port tester comprising:
   a first relay having a switch connected to a first resistor in series, and an inductance coil;
   a second relay having a switch connected to a second resistor in series, and an inductance coil;
   a plurality of serial plugs configured for respectively inserting into serial ports of the electrical device, wherein the plurality of serial plugs is configured for receiving a test signal from the electrical device via one half of the plurality of serial plugs and returning the test signal to the electrical device via the other half of the plurality of serial plugs, to detect the serial ports of the electrical device;
   a water sensor plug corresponding to a water sensor port of the electrical device;
   a direct current (DC) voltage plug connected to the water sensor plug via the switch of the first relay and the first resistor, and connected to the water sensor plug via the switch of the second relay and the second resistor, the first and second resistors respectively configured for simulating a water-sensor wire in a dry condition and a water-sensor wire in a wet condition; and
   two data plugs respectively connected to the inductance coils of the first and second relays, wherein the two data plugs are configured for receiving control signals from the electrical device to control the switch of the first relay and the switch of the second relay; the switch of the first relay is configured for testing electrical device working in a dry condition, and the switch of the second relay is configured for testing the electrical device working in a wet condition.

2. The I/O port tester as claimed in claim 1, wherein the serial plugs, water sensor plug, DC voltage plug, and data plugs are assembled on an I/O port connector, the I/O port connector, first resistor, second resistor, first relay, and second relay are assembled on a circuit board.

3. The I/O port tester as claimed in claim 1, further comprising:
   a DC sensor plug;
   a first relay plug connected to the DC sensor plug; and
   a second relay plug connected to the DC voltage plug, wherein the DC sensor plug, first relay plug, second relay plug and DC voltage plug are connected with tile corresponding I/O ports of the electrical device to form a circuit loop for testing the corresponding I/O ports of the electrical device.

4. The I/O port tester as claimed in claim 3, wherein the serial plugs, water sensor plug, DC sensor plug, first relay ping, second relay plug, DC voltage plug, and data plugs are assembled on an I/O port connector, the I/O port connector, first resistor, second resistor, first relay, and second relay are assembled on a circuit board.

5. The I/O port tester as claimed in claim 1, wherein two of the serial plugs are configured for receiving signals from the corresponding serial ports of the electrical device, and the other two of the serial plugs are correspondingly connected to the two of the serial plugs for transmitting signals to the other corresponding serial ports of the electrical device.

6. An I/O port tester configured for testing input/output (I/O) ports of an electrical device, the I/O ports comprising two serial communication transmitting ports, two serial communication receiving ports, a voltage source port, a direct current (DC) sensor port, a water sensor port, two relay ports, and two data ports, the I/O port tester comprising:
   a first relay having a switch connected to a first resistor in series, and an inductance coil;
   a second relay having a switch connected to a second resistor in series, and an inductance coil;
   two serial plugs corresponding to the serial communication transmitting ports, configured for receiving a test signal from the electrical device;
   two serial plugs corresponding to the serial communication receiving ports, and respectively correspondingly connected to the above two serial plugs, configured for transmitting the test signal to the electrical device;
   a water sensor plug corresponding to the water sensor port;
   a DC voltage plug corresponding to the voltage source port, and connected to the water sensor plug via the switch of the first relay and the first resistor, and connected to the water sensor plug via the switch of the second relay and the second resistor, the first and second resistors configured for respectively simulating a water-sensor wire in a dry condition and a water-sensor wire in a wet condition;
   two data plugs corresponding to the data ports, and respectively connected to the inductance coils of the first and second relays, wherein the two data plugs are configured for receiving control signals from the electrical device to control to the switch of the first relay and the switch of the second relay, to test the electrical device working at a dry condition and a wet condition, respectively;

a DC sensor plug corresponding to the DC sensor port;

a first relay plug corresponding to the one of the relay ports, and connected to the DC sensor plug; and a second relay plug corresponding to the other one of the relay ports, and connected to the DC voltage plug, wherein the DC sensor plug, first relay plug, second relay plug and DC voltage plug are connected with the corresponding I/O ports of the electrical device to form a circuit loop for testing the corresponding I/O ports of the electrical device.

7. The I/O port tester as claimed in claim 6, wherein the serial plugs, water sensor plug, DC sensor plug, first relay plug, second relay plug, DC voltage plug, and data plugs are assembled on an I/O port connector, the I/O port connector, first resistor, second resistor, first relay, and second relay are assembled on a circuit board.

8. A method for testing input/output (I/O) ports of an electrical device, the method comprising:

providing the I/O port tester of claim 6;

inserting the plugs of the tester into the corresponding ports of the electrical device;

the electrical device sending a command signal to the serial communication receiving ports;

the two serial plugs inserted to the serial communication receiving ports receiving the command signal from the electrical device and the other two serial plugs inserted to the serial communication transmitting ports transmitting the command signal to the serial communication transmitting ports, wherein upon a condition that the electrical devices receives the command signal from the tester, the serial communication receiving ports and the serial communication transmitting ports are good;

indicating a first result via an indicating device to show whether serial communication receiving ports and the serial communication transmitting ports of the electrical device are good;

connecting the voltage source port with a power source in the electrical device and connecting the DC sensor port with the power source via the voltage source port, DC voltage plug, the second relay plug, the relay ports, the first relay plug, and the DC sensor plug in turn, wherein upon a condition that the electrical device receives a feedback power signal via the circuit loop, the voltage source port, the relay ports, and the DC sensor port of the electrical device are good;

indicating a second result via the indicating device to show whether the voltage source port, the relay ports, and the DC sensor port of the electrical device are good;

the electrical device sending a control signal to the inductance coil of the first relay via the first data port and the corresponding data plug to close the first relay and make an analog to digital (A/D) converter of the electrical device to test the first resistor;

indicating a third result via the indicating device to show whether the first data port and the water sensor port are good;

the electrical device sending a control signal to the inductance coil of the second relay via the second data port and the corresponding data plug to close the second relay and make the A/D converter of the electrical device to test the second resistor; and indicating a fourth result via the indicating device to show whether the second data port and the water sensor port are good.

9. The method as claimed in claim 8, wherein if the serial communication receiving and transmitting ports are good, the first result is a passing result, if one or more of the serial communication receiving and transmitting ports are bad, the first result is a failing result.

10. The method as claimed in claim 8, wherein if the voltage source port, the DC sensor port, the voltage source port, the relay ports are good, the second result is a passing result, if one or more of the voltage source port, the DC sensor port, the voltage source port, the relay ports are bad, the second result is a failing result.

11. The method as claimed in claim 8, wherein if the first data port and the water sensor port are good, the third result is a passing result, if one or more of the first data port and the water sensor port are bad, the third result is a failing result.

12. The method as claimed in claim 8, wherein if the second data port and the water sensor port are good, the fourth result is a passing result, if one or more of the second data port and the water sensor port are bad, the fourth result is a failing result.

* * * * *